United States Patent
Simon

(10) Patent No.: US 8,552,757 B2
(45) Date of Patent: Oct. 8, 2013

(54) METHOD FOR DETECTING A FAULT IN AN INDUCTION MACHINE

(75) Inventor: Karl-Peter Simon, Grunstadt (DE)

(73) Assignee: Danfoss Drives A/S, Graasten (DK)

( * ) Notice: Subject to any disclaimer, the term of this patent is extended or adjusted under 35 U.S.C. 154(b) by 351 days.

(21) Appl. No.: 12/937,138

(22) PCT Filed: Apr. 8, 2009

(86) PCT No.: PCT/DK2009/000088
§ 371 (c)(1),
(2), (4) Date: Oct. 8, 2010

(87) PCT Pub. No.: WO2009/124549
PCT Pub. Date: Oct. 15, 2009

(65) Prior Publication Data
US 2011/0025371 A1    Feb. 3, 2011

(30) Foreign Application Priority Data

Apr. 9, 2008    (DE) .................. 10 2008 017 900

(51) Int. Cl.
*G01R 31/34*    (2006.01)

(52) U.S. Cl.
USPC ...... 324/765.01; 324/545; 324/546; 318/490; 361/30; 702/58; 702/64

(58) Field of Classification Search
USPC ............. 324/765.01, 545, 546, 772; 318/490; 361/30; 702/58, 64
See application file for complete search history.

(56) References Cited

U.S. PATENT DOCUMENTS

| 5,049,815 | A | * | 9/1991 | Kliman .................. 324/545 |
| 5,644,458 | A |   | 7/1997 | Schoen et al. |
| 5,936,377 | A | * | 8/1999 | Blaschke et al. ............ 318/807 |
| 6,426,633 | B1 | * | 7/2002 | Thybo ..................... 324/511 |
| 6,611,771 | B1 | * | 8/2003 | Habetler et al. ............ 702/58 |
| 6,822,839 | B2 |   | 11/2004 | Habetler |
| 2004/0230844 | A1 | * | 11/2004 | Zalesski ................... 713/300 |
| 2008/0294360 | A1 |   | 11/2008 | Capitaneanu et al. |

FOREIGN PATENT DOCUMENTS

AT    414190    10/2006

OTHER PUBLICATIONS

Jeffrey C. Robertson, Detecting Stator and Rotor Winding Faults in Three-Phase Induction Machines, 1995, ECE Technical Reports (Purdue University E-Pubs), p. ix.*
Seppo J. Ovaska, Soft Computing in Industrial Electronics, 2002, Physica-Verlag Heidelberg-NewYork, p. 74 (Figure 4.1).*

* cited by examiner

*Primary Examiner* — Patrick Assouad
*Assistant Examiner* — Sean Curtis
(74) *Attorney, Agent, or Firm* — McCormick, Paulding & Huber LLP

(57) ABSTRACT

The invention concerns a method for detecting a fault in a rotating field machine, in which current components are analysed in a flux-based, particularly rotor-flux-based, coordinate system a flux-forming current component being subjected to a frequency analysis in the flux-based, particularly rotor-flux-based, coordinate system. It is endeavored to provide a simple method for an early detection of faults. For this purpose, a current operating point is detected for at least one predetermined supply frequency ($f_{sp}$), said operating point being compared to a former operating point.

7 Claims, 5 Drawing Sheets

METHOD FOR DETECTING A FAULT IN AN INDUCTION MACHINE

CROSS REFERENCE TO RELATED APPLICATIONS

This application is entitled to the benefit of and incorporates by reference essential subject matter disclosed in International Patent Application No. PCT/DK2009/000088 filed on Apr. 8, 2009 and German Patent Application No. 10 2008 017 900.0 filed Apr. 9, 2008.

FIELD OF THE INVENTION

Method for detecting a fault in a rotating field machine, in which current components are analysed in a flux-based, particularly rotor-flux-based, coordinate system a flux-forming current component being subjected to a frequency analysis in the flux-based, particularly rotor-flux-based, coordinate system.

BACKGROUND OF THE INVENTION

Such a method is, for example, known from U.S. Pat. No. 5,644,458. Here, stator voltages, stator currents and stator fluxes are transformed from a 3-phase into the stator based 2-phase coordinate system. Subsequently, an additional transformation into the rotor based coordinate system with reference to the rotor flux. In a motor model, these transformed values are further linked with fixed parameters. The current components precalculated in this model are compared to the real current components. When deviations occur, which are larger than a certain percentage in the range from 1% to 25%, an unspecified fault in the motor is assumed.

U.S. Pat. No. 6,822,839 B2 also describes the commonly known coordinate transformation of a 3-phase induction system into a two-axis system. An additional transformation is applied to get information about the real power and the reactive power. By means of the total reactive motor power, a fault detection is performed. However, with a loaded motor this has only minor significance.

SUMMARY OF THE INVENTION

The invention is based on the task of providing a simple method for an early detection of faults.

With a method as mentioned in the introduction, this task is solved in that a current operating point is detected for at least one predetermined supply frequency, said operating point being compared to a former operating point.

Thus, for the analysis a comparison at different times between current data and reference data is used. Such a comparison gives a higher analysis safety than the use of absolute values. Here, the operating points chosen preferably correspond to the operating points actually appearing in the working or driving unit. In the flux-based, in particular rotor-flux-based coordinate system, the orthogonal current components $i_{vekd}$ and $i_{vekq}$ are evaluated. The former current component controls the magnetic field, the latter the torque.

An inductance is assigned to each magnetic flux. In connection with a stator winding fault with partial winding short-circuit, that is, an insulation loss between individual turns of a winding conductor, the inductance, for example, of the corresponding winding conductor will change. The inductances that are no longer symmetrical in all three conductors will cause a pulsation of the flux-forming current component $i_{vekd}$ at double the supply frequency. Where a fault causes the magnet flux to vary a pulsation with double supply frequency will also appear in the torque, or the current component $i_{vekq}$ that is proportional to the torque. However, with increasing motor load and a constant winding fault, the amplitude of the double supply frequency component in the torque signal will decrease, so that during a load the winding fault can practically no longer be detected with this signal. The flux-forming current component $i_{vekd}$ is, however, substantially independent of the torque, so that the fault detection with this current value is also perfectly ensured during nominal load.

Preferably, the former operating point corresponds to a fault-free state of the machine. For example, it can be assumed that in the delivered state the machine is fault-free. Referring the current operating point to a fault-free operating point permits a very sensitive fault diagnosis long before a state, in which the machine is rendered unable to work.

Preferably, a fast Fourier transform is used for the frequency analysis. With a fast Fourier transform (FFT), the frequency spectrum of the flux-forming current component can be calculated relatively fast and safely. By means of this frequency spectrum, it can then be evaluated, whether the machine has faults or not.

Preferably, the fast Fourier transform is made during a time window of a predetermined duration. Thus, the frequency information is obtained during discrete periods. Accordingly, the achieved analysis values can be recorded in data records and stored one by one. The duration of such a period is, for example, in the range from 3 to 5 seconds.

Preferably, the supply frequency ($f_{sp}$) is kept constant during the time window. This can be realised without problems during a time window of a limited duration. If the supply frequency should change during this time window, the corresponding data record will be rejected.

It is also preferred that a symmetric voltage is maintained within the time window. Also this condition is met without problems, when the time window has a limited duration. When the symmetry changes, the corresponding data record is rejected. Here, it is only important that the phase voltages are symmetric. The voltage level is not required here.

Preferably, at least one critical frequency is calculated and the frequency spectrum is analysed at this critical frequency. Thus, the total frequency spectrum that has been achieved by means of the fast Fourier transform need not be analysed. For the detection of a fault, one or a few critical frequencies will be sufficient.

It is preferred that the critical frequency ($f_k$) of a stator fault is determined as $f_k = 2 \cdot f_{sp}$ and of a rotor winding fault as $f_k = 2(f_{sp} - n \cdot p)$, where $f_{sp}$ is the supply frequency, n is the rotor speed and p is the number of pole pairs.

Preferably, the required values are obtained from operational data of a frequency converter. When the frequency converter is operated in the vector control or voltage vector control plus (vvc plus) modes, the required data are available anyway, that is, no further sensors are required to perform the fault monitoring. On the contrary, the fault monitoring can be made by the measured values that are available anyway.

BRIEF DESCRIPTION OF THE DRAWINGS

In the following, the invention is described on the basis of a preferred embodiment in connection with the drawings, showing.

DETAILED DESCRIPTION OF THE PREFERRED EMBODIMENTS

Figure 1:
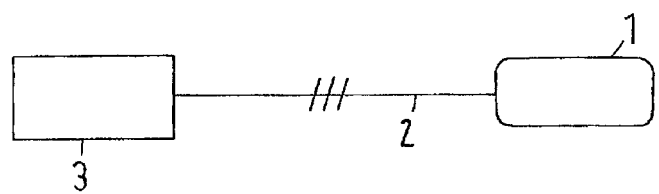
FIG. 1 is a heavily schematised view of a squirrel cage motor with a frequency converter.
Figure 2:
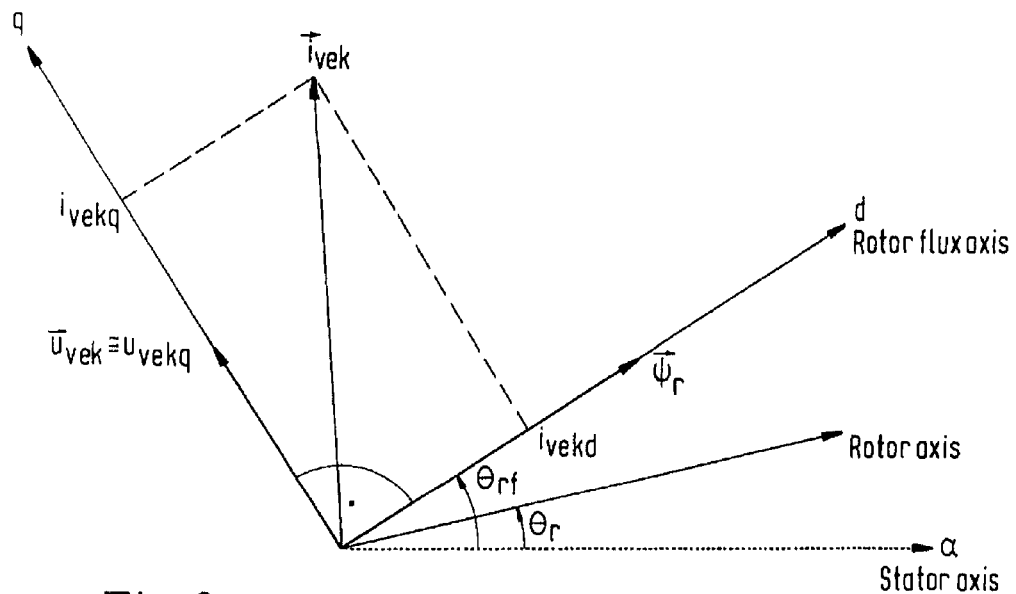
FIG. 2 is a vector diagram explaining some current components.

FIG. 1 is a schematic view of a squirrel cage motor that is connected to a frequency converter 3 via a 3-phase cable 2. The cable 2 can have a length of up to 150 m. The frequency converter 3 supplies the squirrel cage motor 1 in a known manner with a 3-phase AC current that generates a rotating field in the stator of the squirrel cage motor 1.

Even though squirrel cage motors are usually made to be robust, faults may appear, for example the loss of insulation in the stator winding or a broken rod in the rotor winding. Such faults often do not cause an immediate failure of the machine. On the contrary, the motor can continue working. However, it is desired to get early information about a failure, so that during an already planned service break the motor can be repaired or replaced.

When, in the following, a "motor" is mentioned, the fault diagnosis will also apply, when the machine is used as a generator.

When the frequency converter 3 is operated in the vector control or VVC plus (voltage vector control plus) modes, some data will be available, which can be used for the fault diagnosis. Additional sensors, detectors or the like will not be required to detect a fault.

For the fault diagnosis, the space vectors, that is, the stator current components, available in the frequency converter 3 are analysed in the rotor-flux-based coordinate system. In a coordinate system fixed with reference to the magnetic flux $\Psi_r$, orthogonal current components $i_{vekd}$ and $i_{vekq}$ can be obtained. In this connection, $i_{vekd}$ is directed parallel to the rotor flux and controls the magnetic field. $I_{vekq}$ is directed perpendicularly to the current component $i_{vekd}$ and controls the motor torque.

In the vector control or VVC plus operational modes, the frequency converter 3 can calculate the required angle $\theta_{rf}$ for determining the rotating coordinate system (d, q) in relation to the stator winding conductor $\alpha$ without mechanical sensors. A correlation between the motor torque M and $i_{vekq}$ is determined by means of equation (1).

$$M = \frac{3}{2} \cdot p \cdot \frac{L_m}{L_r} \cdot \psi_r \cdot i_{vekq} \qquad (1)$$

In equation (1), the rotor flux $\Psi$, together with $i_{vekd}$ and further motor parameters, results in $$\psi_r = \frac{L_m}{1 + \tau_r \cdot s} \cdot i_{vekd}; \quad \tau_r = \frac{L_r}{R_r} \qquad (2)$$

In this case, s is the Laplace operator in accordance with the control-theory representation of a $1^{st}$ order delay element.

An inductance can be assigned to each magnetic flux. With a stator winding fault with partial winding short-circuit, the inductance of the corresponding winding conductor changes. The inductances that are no longer symmetrical in all three conductors cause a pulsation of the flux-forming current component $i_{vekd}$ at double the supply frequency. Since, in the case of a fault the magnetic flux is no longer constant, a pulsation at double the supply frequency will also appear in the torque or in the current component $i_{vekq}$ that is proportional to the torque.

With increasing motor load and a constant winding fault, however, the amplitude of the double supply frequency component in the torque signal will decrease, so that during a load and by means of the pulsation in the torque signal, the winding fault will not be practically detectable any more. The flux-forming current component $i_{vekd}$ is, however, practically independent of the torque, so that also during nominal load the fault detection by means of this current value is ensured without problems.

An important difference in the significance between the torque and the $i_{vekd}$ exists in the area of the motor supply frequency. Whereas below the motor nominal frequency it is difficult to recognise a difference between fault-free and faulty stator winding with the FFT even with half the nominal load, the FFT of $i_{vekd}$ will, at the same load, provide a fault-free fault detection below half the nominal frequency of the motor.

Thus, for the fault detection, just the following measured values are used: The motor current component $i_{vekd}$ in the flux-based coordinate system, the motor supply frequency $f_{sp}$, the motor speed (when the detection of a rotor fault is desired), and the torque M from equation (1), or, alternatively the corresponding current component $i_{vekq}$.

For each actual load at a supply frequency $f_{sp}$ a ratio between the actual torque and the nominal torque (M/M$_n$) is calculated. The amplitude of the measured value $i_{vekd}$ is analysed in relation to load and frequency by means of the fast Fourier transform (FFT).

The analysis of the measured data is made as a comparison between two operation modes, of which one should correspond to the "healthy", that is, fault-free, motor state. The relation of the current operation point to a reference state permits a very sensitive fault diagnosis long before a state, in which the motor is rendered inoperative.

For a high degree of evaluation safety with regard to the insulation state of the motor winding, the comparison of the data of the current operation point with data from a basic or reference measurement, during which the winding was still fault-free, is extremely helpful. Without a reference measurement, the criteria would have to be evaluated as absolute values, which will, under certain circumstances, result in a less sensitive fault diagnostic.

All relevant data are stored both during the reference measuring and also during the subsequent analysis measurements in dependence of the load state and the supply frequency of the motor.

The FFT is performed within a certain time window of, for example, four seconds, and then evaluated with certain frequencies, which are stated below.

Within the time window, the supply frequency $f_{sp}$ should remain constant. Small deviations within a range of $\pm\Delta f$ are permissible. Further, the voltages of the AC system supplied by the frequency converter should be symmetrical. If these conditions are not met, the corresponding data record is rejected. Basically, a statistical evaluation of several data records is performed.

Figure 3:
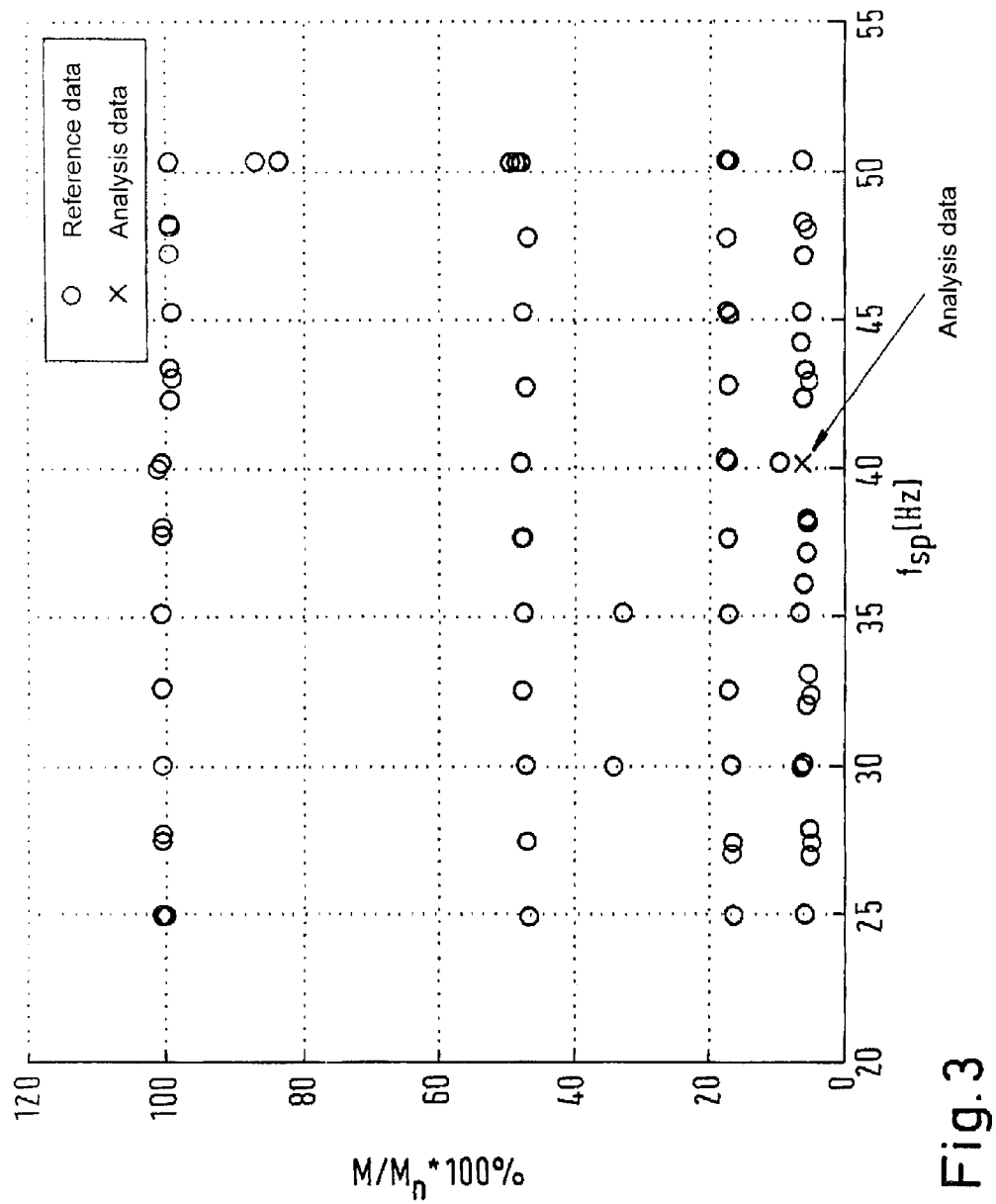
FIG. 3 is statistic distribution of reference values.

For the stator fault analysis, a random motor load between idling and nominal load is possible. FIG. 3 shows a statistical distribution of operating points with $i_{vekd}$ reference data at different frequencies and different load states, which are marked with a circle. These reference data have been detected on a fault-free machine.

FIG. 3 shows a statistical distribution of operating points at a specific load $M/M_n$ and a specific motor frequency $f_{sp}$ in the reference case. For each measuring point that is shown as a circle, $M/M_n$, $f_{sp}$, n, as well as the amplitude of the FFT of $i_{vekd}$ at $2*f_{sp}$ are stored for a measuring cycle over 4 seconds.

If, after recording the reference data (o), the analysis mode is chosen, the same data are stored again, and the statistical distribution of the operating points with regard to load and supply frequency are shown in the same picture by means of an x. The fault indication is now made by a comparison of the $i_{vekd}$ values of the reference memory and the analysis memory.

If o values and x values lie together, this is concrete evidence that a comparison of the related $i_{vekd}$ values is possible. A small difference of the operating points between the load and the supply frequency of reference and analysis data is permissible. If no reference data are adjacent to operating points in the analysis mode, the fault indication is suppressed.

Thus, FIG. 3 merely provides a survey of the operating points, in which a fault indication through comparison is possible.

The cross in FIG. 3 shows the recording of all relevant measuring values in the analysis mode for the randomly selected operating point with approximately 5% load and 40 Hz.

Figure 4:
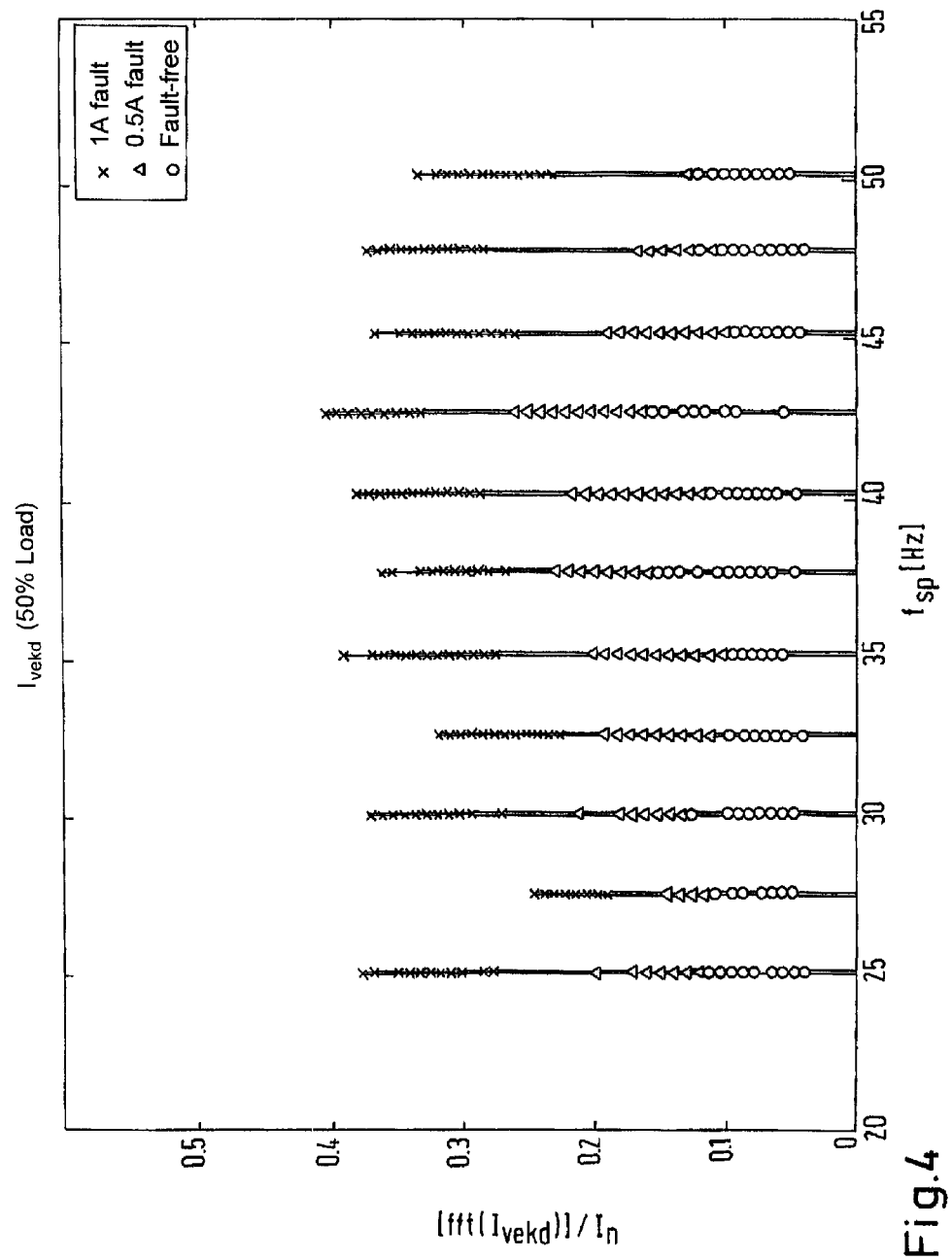
FIG. 4 is a schematic explanation of the fault detection.

As appears from FIG. 4, the analysis of the current component $i_{vekd}$ is extremely significant. From the left to the right it shows the supply frequency $f_{sp}$ and upwards the ratio of the corresponding current component from the fast Fourier transform with reference to the nominal value of the current.

It can be seen that there is a clear difference between fault values at a fault current of 1 A and the fault-free case. Also with a small fault current of 0.5 A (shown with triangles) the fault case can still be clearly distinguished from the fault-free case. In both cases the motor is still fully functional.

After the fast Fourier transform, it is not necessary to examine the whole frequency spectrum. As mentioned above, it is sufficient to examine the critical frequency $f_k$. The value of this frequency depends on, whether a fault in the stator or in the rotor is to be examined.

For a stator winding fault, it appears that $$f_k = 2 \cdot f_{sp}$$

For a rotor winding fault, it appears that $$f_k = 2 \cdot (f_{sp} - n \cdot p)$$

In this connection, $f_{sp}$ is the supply frequency, n is the speed of the rotor and p is the pole pair number of the motor.

Figure 5:
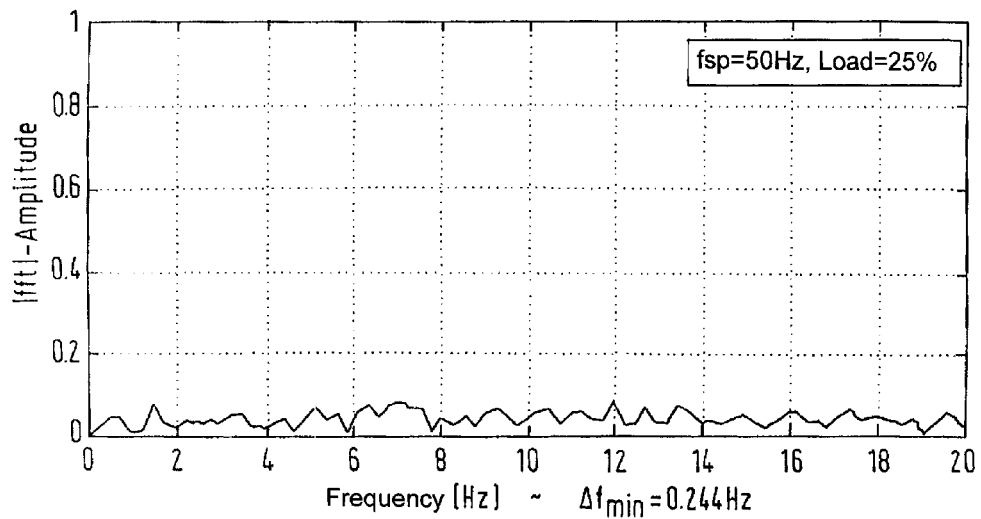
FIG. 5 is an FFT spectrum of the torque.
Figure 6:
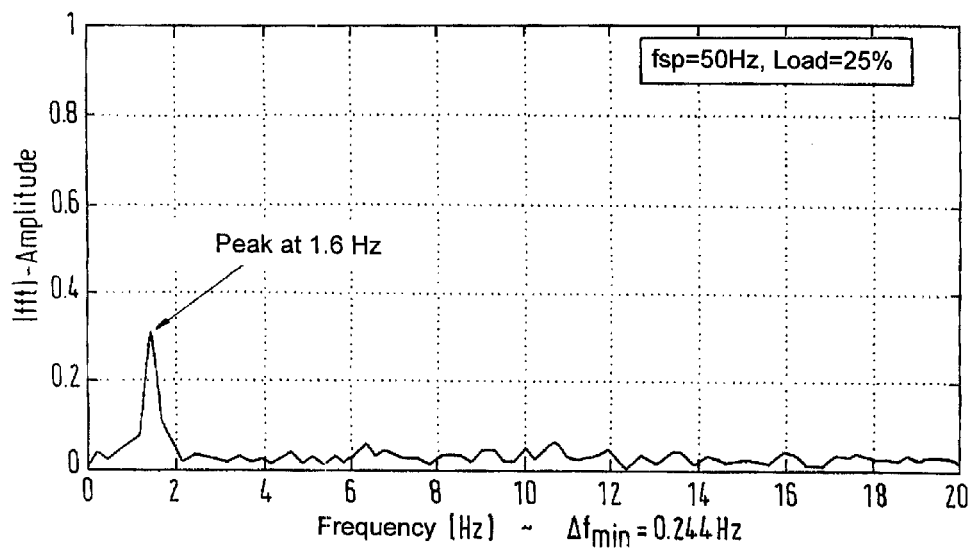
FIG. 6 is an FFT spectrum of the flux-forming current components.

The FIGS. 5 and 6 show, how effective the analysis of the current component $i_{vekd}$ (FIG. 6) also is in connection with rotor winding faults, when compared to the known torque analysis (FIG. 5) that permits practically no fault detection with small loads of 25%.

FIG. 5 shows the spectral distribution in the torque M achieved by means of a fast Fourier transform. A significant indication of whether or not a fault exists is practically not possible at any frequency.

FIG. 6 shows the spectral distribution achieved by the fast Fourier transform of the current component $i_{vekd}$. Here a peak is clearly visible at 1.6 Hz. This is a peak at the critical frequency $f_k$ for the corresponding operating state of the squirrel cage motor. Such fault detection is possible even with a small motor load of 25% of the nominal torque.

For the diagnosis of the machine, therefore, the spectral distribution of the magnetising current component $i_{vekd}$ is detected by means of the fast Fourier transform, and the result is displayed as Evaluation factor=(FFT($i_{vekd}$(defective motor))/FFT($i_{vekd}$ (healthy motor))·100% statistically averaged for each current motor load.

Depending on the severity of the insulation loss in the stator winding, this factor increases from the "healthy" value 100% to values up to 500%.

Figure 7:
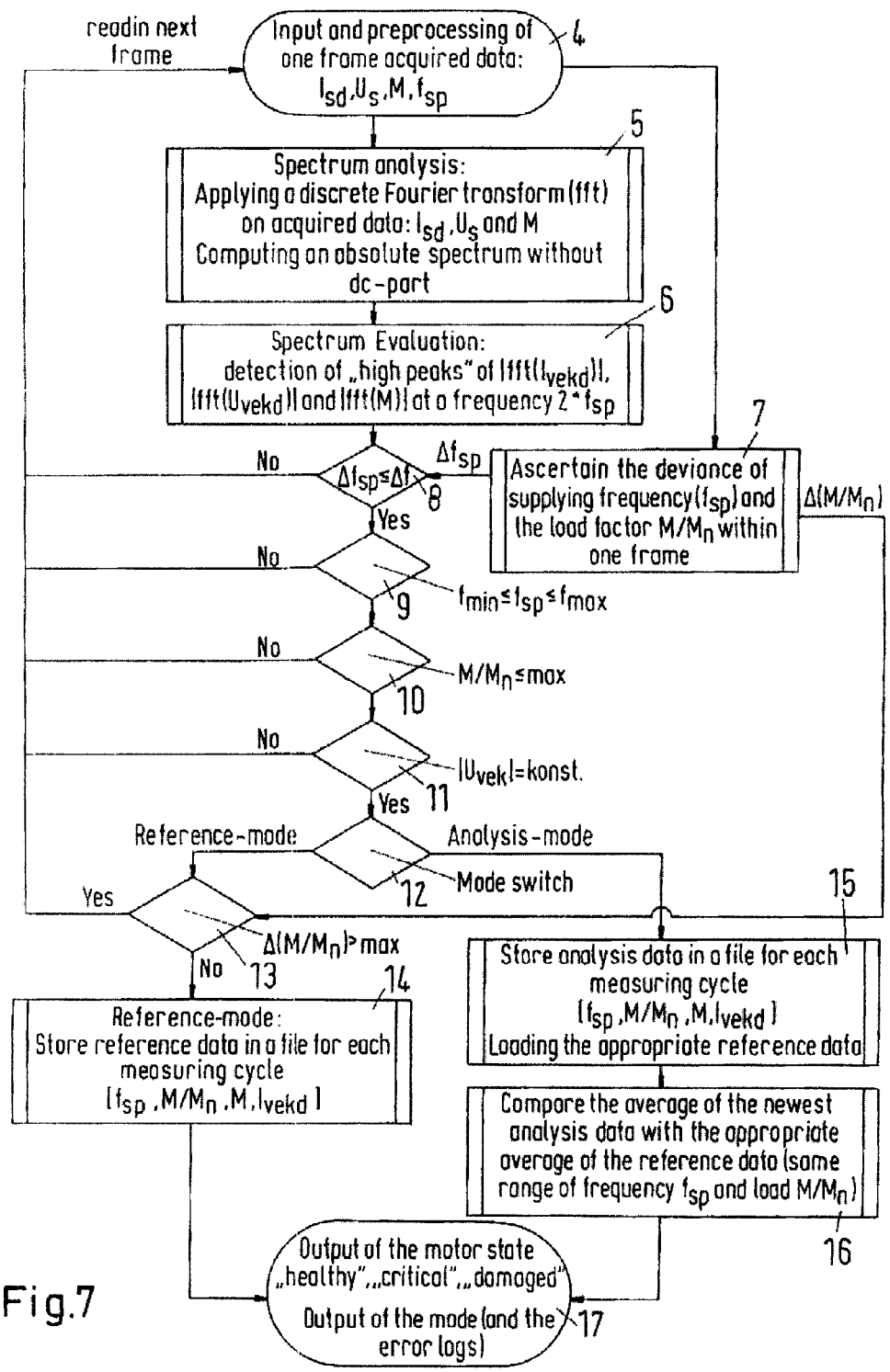
FIG. 7 is a flow diagram.

FIG. 7 shows schematically in the form of a flow diagram the course of the method using stator winding faults as an example. In an initial step 4 the required data are detected and united to a "frame" or a data record. The data concerned are the stator current $I_{sd}$, the stator voltage $U_s$, the torque M and the supply voltage $f_{sp}$.

In a subsequent step an analysis of the spectrum is made, using a discrete Fourier transformation on the data $I_{vekd}$, $U_{vek}$ and M obtained from the spectrum, thus detecting an absolute spectrum without a DC component.

In a step 6 the spectrum is evaluated. Peaks of the critical frequency $2 \cdot f_{sp}$ of the current component $I_{vekd}$, the voltage $U_{vek}$ and the torque M are detected.

The data achieved in step 4 are tested in a monitoring step 7 to determine if the supply frequency $f_{sp}$ and the load factor $M/M_n$ remain constant with the required accuracy within a "frame". Small deviations $\Delta f_{sp}$ and $\Delta(M/M_n)$ are permissible.

In a test step 8, it is tested if the supply frequency is sufficiently constant, that is, if $\Delta f_{sp}$ is smaller than a specified $\Delta f$. If this is the case (yes), the procedure continues. If this is not the case (no), the corresponding data record (frame) is rejected.

In a further step 9 it is tested, if the supply frequency $f_{sp}$ is within a permissible frequency range that reaches from $f_{min}$ to $f_{max}$. If this is the case, the procedure continues. If this is not the case, the corresponding data record is rejected.

In a further step 10 it is tested, if the motor operates in the permissible load range, that is, if the ratio between the actual torque M and the nominal torque $M_n$ is smaller than a specified maximum value max. If this is the case, the procedure continues. If this is not the case, the data record is rejected.

In a further test step, it is tested if the supply voltage amount $U_{vek}$ is constant, that is, if the phase voltages are symmetrical. If this is the case, the procedure is continued. If this is not the case, the corresponding data record is rejected.

In a step 12, the operation mode is selected. In a reference mode the data for the fault-free motor are detected. In step 13, it is tested if the torque M was sufficiently constant. If the torque deviation $\Delta(M/M_n)$ exceeds a certain maximum value max, the data record is rejected. If the deviation is below this value, the procedure continues. In this case, in a step 14, the corresponding reference data for each measuring cycle are stored in a memory. The data concerned are supply frequency $f_{sp}$, load factor $M/M_n$, torque M and flux-forming current component $I_{vekd}$.

If, however, the motor is analysed during subsequent operation, the previously detected measuring values supply frequency $f_{sp}$, load factor $M/M_n$, torque M and flux-forming current component $I_{vekd}$ are stored for each measuring cycle, and the corresponding reference data are downloaded. For this purpose, a step 15 is provided.

In a step 16, the average of the most recent analysis data are compared to a suitable average of the reference data. Here, the same frequency region for the supply frequency $f_{sp}$ and the same load factor $M/M_n$ are used.

From this comparison, the motor state can be displayed in a step 17, the simplest case being a distinguishing between "healthy", "critical" and "damaged".

This evaluation can also be stored.

While the present invention has been illustrated and described with respect to a particular embodiment thereof, it should be appreciated by those of ordinary skill in the art that various modifications to this invention may be made without departing from the spirit and scope of the present.

What is claimed is:

1. A method for detecting a fault in a rotating field machine having a motor connected to a frequency converter, in which current components are analysed at the frequency converter in a flux-based, particularly rotor-flux-based, coordinate system, a flux-forming current component ($i_{vekd}$) being subjected to a frequency analysis at the frequency converter in the flux-based, particularly rotor-flux-based, coordinate system, wherein a current operating point is detected at the frequency converter for at least one predetermined supply frequency ($f_{sp}$), said operating point being compared to a former operating point stored in a reference memory;

wherein at least one critical frequency ($f_k$) is calculated and the frequency spectrum is analysed at this critical frequency ($f_k$); and wherein the critical frequency ($f_k$) of a stator fault is determined as $$f_k = 2 \cdot f_{sp}$$

and of a rotor winding fault as $$f_k = 2(f_{sp} - n \cdot p)$$

where:

$f_{sp}$ is the supply frequency, n is the rotor speed, and p is the number of pole pairs.

2. The method according to claim 1, wherein the former operating point corresponds to a fault-free state of the machine.

3. The method according to claim 1, wherein a fast Fourier transform is used for the frequency analysis.

4. The method according to claim 3, wherein the fast Fourier transform is made during a time window of a predetermined length.

5. The method according to claim 4, wherein the supply frequency ($f_{sp}$) is kept constant during the time window.

6. The method according to claim 4, wherein a symmetric voltage is maintained within the time window.

7. The method according to claim 1, wherein the required values are obtained from operational data of the frequency converter.

* * * * *